United States Patent

Leiphart

[11] Patent Number: 5,928,480
[45] Date of Patent: *Jul. 27, 1999

[54] METHODS OF SPUTTER DEPOSITING OF METALS ONTO SUBSTRATES, AND METHODS OF FORMING PLASMA

[75] Inventor: Shane P. Leiphart, Boise, Id.

[73] Assignee: Micron Technology, Inc., Boise, Id.

[*] Notice: This patent is subject to a terminal disclaimer.

[21] Appl. No.: 08/883,027

[22] Filed: Jun. 26, 1997

Related U.S. Application Data

[63] Continuation of application No. 08/672,979, Jun. 28, 1996, Pat. No. 5,667,645.

[51] Int. Cl.⁶ .................................................. C23C 14/54
[52] U.S. Cl. .............................. 204/192.13; 204/192.12; 204/192.17; 427/569; 427/576; 216/67
[58] Field of Search ..................... 204/192.12, 192.13, 204/192.17, 298.03, 192.32, 192.33; 427/569, 576; 216/67, 68, 69, 70, 71

[56] References Cited

U.S. PATENT DOCUMENTS

| | | | |
|---|---|---|---|
| 4,124,474 | 11/1978 | Bomchil et al. | 204/192.13 |
| 4,428,811 | 1/1984 | Sproul et al. | 204/192.13 |
| 4,440,618 | 4/1984 | Suzuki et al. | 204/298.03 |
| 4,894,132 | 1/1990 | Tanaka | 204/192.13 |
| 4,975,168 | 12/1990 | Ohno et al. | 204/192.13 |
| 5,064,520 | 11/1991 | Miyake et al. | 204/192.11 |
| 5,114,556 | 5/1992 | Lamont, Jr. | 204/192.12 |
| 5,173,327 | 12/1992 | Sandhu et al. | 427/573 |
| 5,292,417 | 3/1994 | Kügler . | |
| 5,358,901 | 10/1994 | Fiordalice et al. | 437/192 |
| 5,378,501 | 1/1995 | Foster et al. | 427/225.2 |

*Primary Examiner*—Nam Nguyen
*Assistant Examiner*—Gregg Cantelmo
*Attorney, Agent, or Firm*—Wells, St. John, Roberts, Gregory & Matkin, P.S.

[57] ABSTRACT

A method for sputtering metal from a sputtering target includes: a) providing a reaction chamber; b) providing a substrate within the reaction chamber; c) providing a metal target within the reaction chamber, the metal target comprising an eroding surface; d) providing a gaseous mixture comprising argon gas and at least one of helium gas or neon gas; e) forming a plasma from said gaseous mixture, the plasma having a threshold plasma pressure below which the plasma will not exist, the ratio of argon gas to other plasma components being selected to substantially minimize the threshold plasma pressure; f) impacting components of the plasma onto the eroding surface of the metal target to dislodge target atoms therefrom; and g) depositing the dislodged target atoms onto the substrate. In another aspect, a method for substantially maximizing a mean free path of dislodged target atoms within a reaction chamber comprises: a) providing a target within the reaction chamber; b) providing a gaseous mixture within the chamber, the gaseous mixture comprising argon gas and at least one of helium gas or neon gas, and thereby comprising a ratio of argon gas in the gaseous mixture; c) forming a gaseous-mixture plasma from the gaseous mixture, the plasma comprising plasma components; and d) impacting the plasma components with the target to dislodge target atoms therefrom, the ratio of argon in the plasma to other plasma components being selected to substantially maximize the mean free path of the dislodged target atoms.

14 Claims, 3 Drawing Sheets

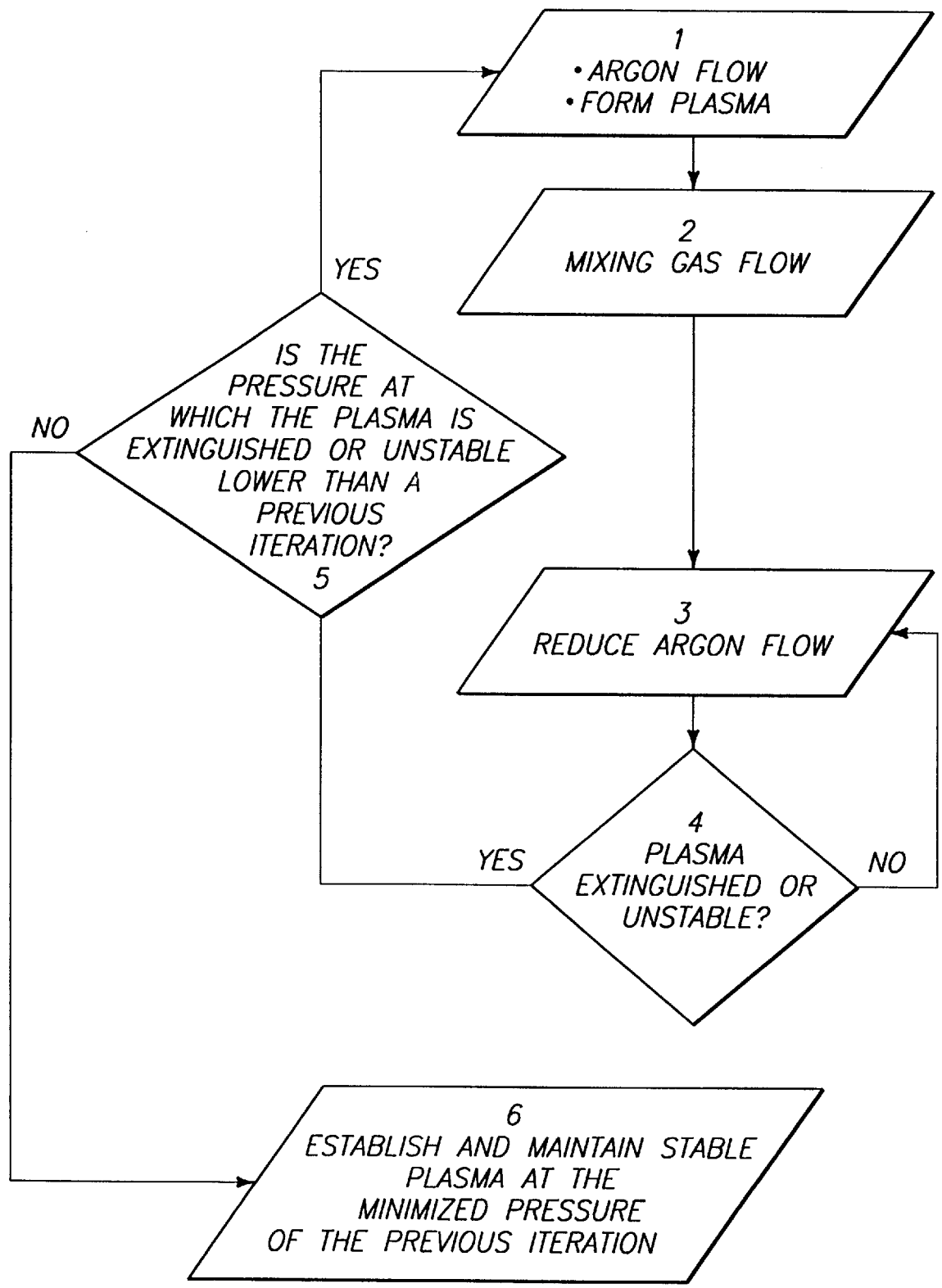

METHODS OF SPUTTER DEPOSITING OF METALS ONTO SUBSTRATES, AND METHODS OF FORMING PLASMA

RELATED PATENT DATA

This patent resulted from a continuation application of U.S. Pat. application Ser. No. 08/672,979, filed on Jun. 28, 1996, and now U.S. Pat. No. 5,667,645.

TECHNICAL FIELD

This invention relates to methods of sputter deposition, and specifically relates to methods of sputter deposition for application to semiconductor fabrication.

BACKGROUND OF THE INVENTION

The present invention relates in general to a method for depositing a layer of material, such as a metal, onto a substrate surface, such as a semiconductor wafer. The method of this invention is particularly advantageous for enhancing metal deposition over and within complex, minuscule surface structures such as those encountered in the Ultra Large Scale Integration (ULSI) and "beyond" technologies of semiconductor device fabrication.

Microelectronic structures frequently use thin, conductive metal layers as device interconnects. The device interconnects provide electrical connection between devices ultimately formed within and upon the substrate. Among the metals commonly used in the formation of such interconnects are tungsten and titanium. Ideally, in the formation of such interconnects, a metal layer is deposited uniformly across the topography of the substrate surface and uniformly extends within small grooves, channels and openings provided within the surface. Such grooves, channels and openings generally define the ultimate location of device interconnects. Uniformly filling such grooves, channels and openings becomes increasingly difficult as devices, and their interconnects, become increasingly more miniature.

A prior art method for providing a conductive metal layer over a semiconductor substrate is sputter deposition. A sputter deposition apparatus, and a method for using such apparatus to deposit metal onto a substrate, is described with reference to FIGS. 1 and 2. Apparatus 10 comprises an outer wall 12 surrounding a reaction chamber 14. Outer wall 12 comprises an interior surface 11 and an exterior surface 13. A plurality of ports 16 extend through outer wall 12 and thereby enable gases to be flowed into and out of reaction chamber 14. In the shown embodiment, two such ports 16 are provided, one of which is in fluid connection to gas sources 18 and 20 and the other of which is in fluid connection to a pump 22. In operation, gases flow from sources 18 and 20 through reaction chamber 14 and toward pump 22. A series of valves (not shown) regulates the rate of flow of such gases. The gases flowed are generally noble gases, such as argon, helium or neon, or mixtures thereof.

The shown apparatus comprises two gas sources, and is thereby configured for flowing a gas mixture into reaction chamber 14. This is typical of apparatuses utilized for conducting sputter deposition.

Within reaction chamber 14 there is provided a target 24, a collimator 26 and a substrate 28. Target 24 comprises an erodible surface 30. Erodible surface 30 contains atoms which are ultimately to be sputter deposited onto an exposed surface 29 of substrate 28. A power source 32 is provided in electrical connection with target 24. Power source 32 may be any of a number of sources known to persons of ordinary skill in the art, including: Direct Current (DC) sources, Alternating Current (AC) sources, and Radio Frequency (RF) sources. Also, a matching network (not shown) may be placed between power source 32 and target 24 for impedance matching the source to the reaction chamber. Generally, as shown, outer wall 12 is grounded, and most generally both the interior surface 11 and the exterior surface 13 of outer wall 12 are grounded.

Substrate 28 is typically in electrical connection to an electrical component 34 exterior to reaction chamber 14. Component 34 may simply be a ground, or it may be some other device generally known to persons of ordinary skill in the art, including, an RF generator, an AC source, or a DC source. Also, a matching network (not shown) may be placed between component 34 and substrate 28 for matching the impedance of component 34 with reaction chamber 14.

In operation, a noble gas is flowed into chamber 14, and a target power is established with power source 32 to generate a plasma from the gas within chamber 14. As mentioned above, most commonly the gas used for generation of such plasma will be argon, but mixtures of argon with helium and/or neon are also occasionally used.

The power source 32 and electrical component 34 together maintain an electric field within chamber 14 which directs plasma ions toward erodible surface 30 of target 24. As the ions collide with erodible surface 30, target atoms are sputtered therefrom. The sputtered target atoms eject from target 24 over a wide angular spread of trajectories. Some of these target atoms reach surface 29 of substrate 28, become deposited onto the surface, and accordingly form a layer of target atoms across the surface 29.

Collimator 26, if present, selectively filters the sputtered atoms having particular trajectories to create a stream of sputtered atoms which are substantially parallel with one another. By such selective filtering of the sputtered atoms, collimator 26 helps to ensure that a uniform layer of target atoms will be deposited across the flat surfaces of substrate 28. Particularly, collimator 26 can help to ensure that sputtered material goes into, and fills, small grooves, channels and openings in the substrate, rather than simply creating a skin across such structures. Collimator 26 may be charged, grounded, or electrically floated within reaction chamber 14.

Even with a collimator 26, it is difficult to achieve highly uniform coverage of target atoms across a substrate surface. One of the reasons for this difficulty may be that target atoms collide with particles in the reactor—such as plasma components, background (neutral) gas, or each other—after passing the collimator and thereby acquire a trajectory non-parallel to the trajectories of other target atoms. If sputtered target atoms approach surface 29 from multiple angular trajectories, the target atoms are more likely to deposit on the outer edges of small grooves, channels and openings, rather than within such structures. Once target atoms adhere to the outer edges of such structures, the openings into the structures are narrowed. It therefore becomes increasingly difficult to fill the structures and increasingly more likely that the structures will simply be covered, rather than filled. This problem becomes exacerbated with smaller devices, wherein the openings are exceedingly small to start with, and wherein relatively minor differences in the trajectories of sputtered target atoms can lead to gross defects in the uniformity of coverage across surface topologies of surface 29.

A method for reducing the probability of the above-described undesired collisions of target atoms with plasma components would be to develop a plasma which could be sustained at very low pressures, for a given power, and to then reduce the pressure within reaction chamber 14 to the threshold pressure of the plasma, i.e, to the pressure below which the plasma will no longer exist.

Presently, such minimization of threshold plasma pressure is not utilized with sputtering processes. Instead, the state of the art is to perform a calculation, such as the throw distance calculation discussed in U.S. Pat. No. 5,114,556, which balances the need for rapid deposition with a desire to decrease pressure. However, with devices becoming increasingly miniaturized, it is becoming increasingly important to develop plasmas which can be sustained at very low pressures, hereafter referred to as "low-pressure plasmas". A complication with developing such low pressure plasmas is that the ideal composition of the plasma will vary depending on the configuration of the reaction chamber 14. A general method for determining such an ideal composition for any reaction chamber configuration, and for ascertaining the threshold plasma pressure of such an ideal composition, is addressed by the present invention.

BRIEF DESCRIPTION OF THE DRAWINGS

Preferred embodiments of the invention are described below with reference to the following accompanying drawings.

FIG. 3 is a flow chart illustrating an embodiment of the process of the present invention.

SUMMARY OF THE INVENTION

The invention pertains to a method for forming a substantially stable plasma at a substantially minimized pressure within a reaction chamber of any configuration, and for utilizing the substantially stable plasma in a sputter deposition process. Alternatively, the invention comprises a method for substantially maximizing the mean free path of sputtered target atoms within a reaction chamber during a sputter deposition process.

DESCRIPTION OF SPECIFIC EMBODIMENTS

This disclosure of the invention is submitted in furtherance of the constitutional purposes of the U.S. Patent Laws "to promote the progress of science and useful arts" (Article 1, Section 8).

The method disclosed herein is based on a finding that the pressure of a plasma gas can be substantially minimized by mixing a percentage of one or both of helium gas and neon gas into a predominantly argon based plasma. Plasmas formed from such a mixture are generally stable at lower pressures than plasmas formed from argon gas alone. This is likely because the additive gases (helium and/or neon) have a high secondary electron coefficient and therefore emit large numbers of electrons per impact of electron or ion compared to argon.

Figure 1:
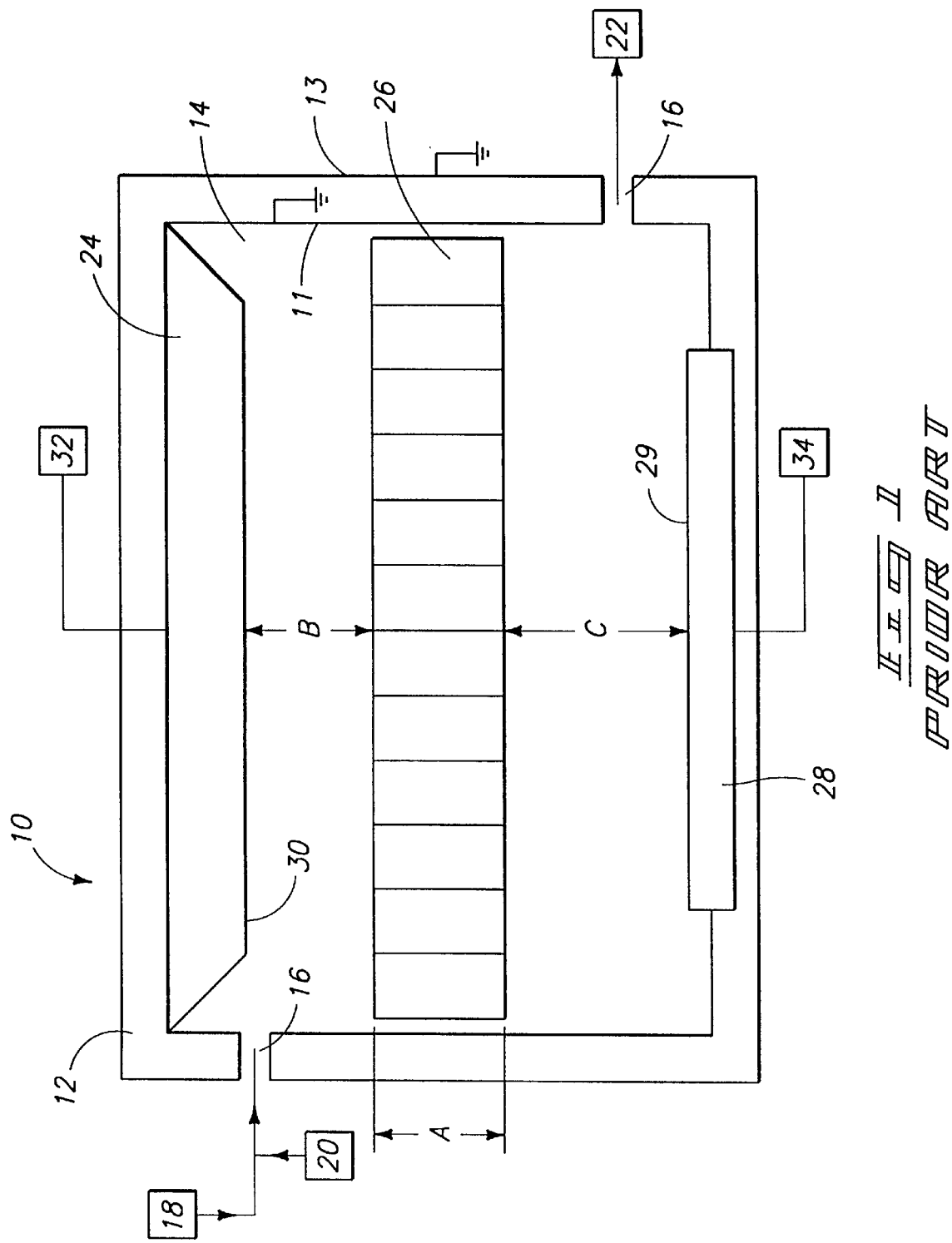
FIG. 1 is a schematic cross-sectional diagram of a first embodiment of a prior art sputtering chamber.
Figure 2:
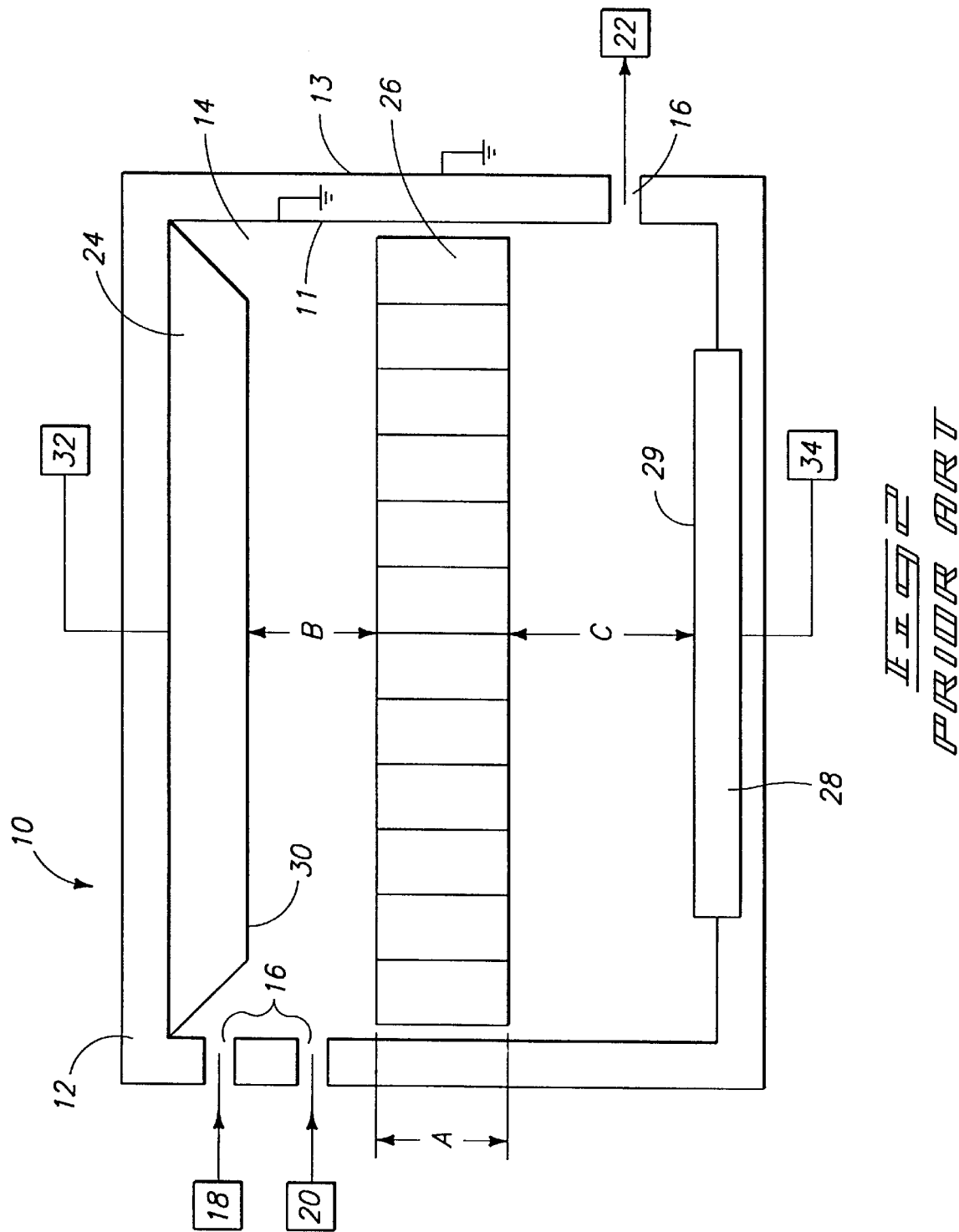
FIG. 2 is a schematic cross-sectional diagram of a second embodiment of a prior art sputtering chamber.

The method is described with reference to the flow chart of FIG. 3, and with reference to the apparatuses of FIGS. 1 and 2. Referring to the flow chart of FIG. 3, in one embodiment the method of the invention comprises six steps.

The first step (step 1 in FIG. 3) comprises flowing argon gas from source 18 through reaction chamber 14 at an argon gas flow rate. The argon gas flow rate of step 1 is an initial argon gas flow rate which will be decreased throughout the process. The initial argon gas flow rate of step 1 is preferably about the lowest flow rate which will sustain a stable plasma, such as about 20 Standard Cubic Centimeters per Minute (Sccm) as described below in Example 1. Step 1 also comprises forming a plasma within reaction chamber 14 from the argon gas. Typically, the plasma is formed by setting power source 32 to a desired target power, which is then electrically transferred to sputtering target 24. The desired target power is chosen such that a plasma may be generated and sustained within reaction chamber 14. The preferred value for the desired target power varies depending on the configuration of reaction chamber 14. A preferred target power and reaction chamber is described below in Example 1.

The presence of a plasma within reaction chamber 14 can be monitored by several methods known to persons of ordinary skill in the art, including monitoring the current from power source 32 to target 24. If a plasma exists within chamber 14, the plasma will complete a circuit from target 24 to chamber walls 11 and to substrate 28. Accordingly, the current between source 32 and target 24 will have a value substantially greater than zero. If no plasma is formed, no such complete circuit will exist and the current will be substantially equal to zero. Preferably, the flow rate of argon gas into chamber 14 is adjusted to the minimum flow rate which will sustain a plasma within reaction chamber 14.

In step 2 of FIG. 3, a mixing gas comprising at least one of helium gas or neon gas is flowed from source 20 and through reaction chamber 14 at a mixing gas flow rate. The mixing gas flow rate of step 2 is an initial mixing gas flow rate which will be increased throughout the process. Accordingly, the mixing gas flow rate of step 2 is generally relatively low, such as about 1 Sccm as described below in Example 1. The mixing gas is incorporated into the plasma in reaction chamber 14 as the mixing gas is flowed into reaction chamber 14. In FIG. 1, the mixing gas and argon are shown being mixed prior to entry into reaction chamber 14. However, in alternate embodiments of the apparatus 10, such as shown in FIG. 2, a separate port is provided for the mixing gas so that the gas from source 20 and the gas from source 18 are mixed subsequent to entry into reaction chamber 14. In any event, after the flow of mixing gas is started, there will preferably be a short wait, before the below-discussed step 3, to allow a homogeneous and stable mixture of argon gas and mixing gas to permeate throughout reaction chamber 14 and become uniformly incorporated into the plasma.

Such stabilization can be monitored by measuring the current or voltage from power source 32 to target 24. When the mixing gas is first introduced into the argon, the current will generally fluctuate as the mixing gas is in homogeneously dispersed through the plasma. Then, as the mixing gas becomes evenly dispersed throughout reaction chamber 14 and the plasma, the current will stabilize.

The pressure within the chamber 14 will generally depend upon a total gas flow rate which comprises all of the gas flow rates into the chamber. Accordingly, the pressure within the chamber will depend upon the mixing gas flow rate and argon gas flow rate, which together comprise at least part of a total gas flow rate into the chamber 14. The reason that it is stated that the mixing gas flow rate and argon flow rate comprise "at least part" of the total gas flow rate is that it is possible to have additional gases flowing in the reaction chamber 14, in addition to the mixing gas and the argon gas.

In step 3 of FIG. 3, the argon gas flow rate is reduced by an argon flow reduction amount. An example an argon flow reduction amount is described in Example 1 below as 1.0 Sccm.

In step 4 of FIG. 3, it is ascertained if the plasma within reaction chamber 14 has been extinguished by step 3. As discussed above, this can be ascertained by a number of methods known to persons of ordinary skill in the art, including monitoring the current between power source 32 and target 24. If the plasma is not extinguished, then step 3 is repeated at a lower argon gas flow rate. In an alternative embodiment of the invention, whether the plasma reaches a predetermined degree of instability will be ascertained, rather than whether the plasma is necessarily extinguished. Steps 3 and 4 are repeated until the plasma is either extinguished or unstable. For the purpose of streamlining the remaining discussion, it will be presumed that the steps 3 and 4 are repeated until the plasma is extinguished, with the understanding that the same steps apply if the instability of the plasma is the determining factor.

Once the plasma is extinguished, a factor related to the pressure in the reaction chamber 14 at which the plasma was extinguished is ascertained. This factor may be the actual pressure, or it may be something upon which the pressure depends, such as the total flow rate of gases into the chamber 14.

After the pressure-related factor of step 4 is determined, steps 1–4 are repeated in a subsequent iteration of the process of the present invention, with the subsequent iteration having a higher mixing gas flow rate than the previous iteration. Preferably, the initial argon flow rate in the subsequent iteration is about the same as that of the previous iteration.

Once the plasma of the subsequent iteration is extinguished, a factor related to the pressure in the reaction chamber 14 at which the plasma was extinguished is ascertained. As described above, this factor may be the actual pressure, or may be something upon which the pressure depends, such as the total flow rate of gases into the chamber 14. Preferably, the same factor will be determined in the subsequent iteration as was determined in the previous iteration.

In step 5 of FIG. 3, the pressure-related factor from the subsequent iteration is compared to the pressure-related factor from the previous iteration of the process. Preferably, a pressure-related factor from a subsequent iteration is compared to the pressure-related factor of an immediately prior iteration. If the comparison of pressure-related factors indicates a decreased pressure of the subsequent iteration relative to the previous iteration, steps 1–5 are repeated. If the comparison of pressure-related factors indicates as an increased pressure of the subsequent iteration relative to the previous iteration, a plasma is established and maintained at the lower pressure of the previous iteration, as shown in step 6 of FIG. 3. The lower pressure of the previous iteration represents a pressure that is just above the threshold pressure of the plasma. Thus, the pressure has been set to a substantially minimal pressure required to sustain the plasma.

The substantially minimized pressure of the previous iteration is generally obtained by establishing the mixing gas flow rate of the previous iteration and the lowest argon gas flow rate of the previous iteration at which a stable plasma was obtained.

Through the above-described 6-step method, a plasma is formed within reaction chamber 14 wherein the ratio of argon gas to other plasma components is selected to substantially minimize the threshold plasma pressure as described above. The 6-step method is broadly applicable to various chamber designs, and can therefore be used to substantially minimize the threshold pressure of a noble gas containing plasma within virtually any reaction chamber configuration.

Once the substantially stable plasma is formed at substantially minimized pressure within the reaction chamber 14, the plasma components may be impacted onto erodible surface 30 of target 24 to sputtered target atoms therefrom. Typically, target 24 will comprise a metal, such as titanium, so that the sputtered target atoms are metallic atoms. In any event, the sputtered target atoms will have a mean free path. The mean free path is the average distance travelled by sputtered target atoms between collisions with particles in the reaction chamber. Because the pressure necessary to maintain a substantially stable plasma within reaction chamber 14 was substantially minimized by the above-described 6-step method, the mean free path of the sputtered target atoms is substantially maximized. In other words, the ratio of argon to other plasma components which was selected to substantially minimize the pressure of a substantially stable plasma also substantially maximizes the mean free path of sputtered target atoms. Thus, the sputtered target atoms are deposited on surface 29 of substrate 28. Typically, substrate 28 is a semiconductor wafer comprising a semiconducting material such as silicon.

By minimizing the pressure within reaction chamber 14, and thereby maximizing the mean free path of sputtered target atoms, the method provides for a process in which the uniformity of target atoms deposited over a substrate is enhanced. Such a process is particularly advantageous in applications in which a metal is deposited onto a semiconductor substrate having ultra-small devices thereon, such as is required in, for example, ULSI applications.

EXAMPLE 1

The reaction chamber used for these example reaction conditions is described with reference to illustrated chamber 14 of FIG. 1. The reaction chamber comprised a collimator width "A" of 3.5 centimeters, a distance "B" from collimator 26 to target 24 of 3 centimeters, and a distance "C" from the collimator to the substrate of about 4 centimeters.

The conditions for maintaining a substantially stable plasma at substantially minimized pressure were determined as follows.

First, a target power of 5 Kilowatts (Kw) was established, and an argon gas flow rate of 20 Sccm was provided to generate a plasma within the reaction chamber.

Next, a mixing gas of neon was flowed into the chamber at a flow rate of 1 Sccm. The reaction chamber took approximately 5 seconds to stabilize.

The argon flow rate was then reduced by 1 Sccm, and the plasma was found to not be extinguished.

Accordingly, the argon flow rate was reduced by an additional 1 Sccm. This time the plasma was extinguished. The total gas flow rate at which the plasma was extinguished was:

18Sccm (Argon)+1Sccm (mixing gas)=19Sccm (total)

Next, the argon gas flow rate was initiated at 20 Sccm, the mixing gas flow rate increased to 2 Sccm and a plasma formed in the reaction chamber. The argon flow rate was then reduced by 1 Sccm. and the plasma was found to not be extinguished. Through subsequent iterations of this process it was found that the plasma was extinguished at an argon flow rate of 16 Sccm. Since the pressure within the chamber at 16 Sccm argon and 2 Sccm mixing gas (total gas flow rate=18 Sccm) was less than the pressure at 18 Sccm argon and 1 Sccm (total gas flow rate=19 Sccm) mixing gas the process of the invention was repeated.

Accordingly, the argon flow rate of 20 Sccm was re-established, the mixing gas flow rate was increased to 3 Sccm and the plasma was re-formed. This time it was determined that the plasma was extinguished at an argon flow rate of 13 Sccm. Since the pressure within the chamber at 13 Sccm argon and 3 Sccm mixing gas (total gas flow rate=16 Sccm) was less than the pressure at 16 Sccm argon and 2 Sccm mixing gas (total gas flow rate=18 Sccm), the process of the present invention was repeated.

An argon flow rate of 20 Sccm was re-established, the mixing gas flow rate was increased to 4 Sccm and the plasma was re-formed. The plasma was found to extinguish at argon flow rates of 13 Sccm. Since the pressure within the chamber at 13 Sccm argon and 4 Sccm mixing gas (total gas flow rate=17 Sccm) was greater than the previous iteration pressure of 13 Sccm argon and 3 Sccm mixing gas (total gas flow rate=16 Sccm), it was determined that the conditions for maintaining a substantially stable plasma at substantially reduced pressure were the conditions of the previous iteration.

Thus, the conditions for maintaining a substantially stable plasma at substantially reduced pressure were determined to be 5 Kw target power, a flow rate of argon of 14 Sccm, and a flow rate of mixing gas (neon) of 3 Sccm. Under such conditions it is found that a silicon substrate having a 200 mm diameter can be covered by a 2000 Angstroms thick metal layer within about 5 minutes.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or is modifications within the proper scope of the appended claims appropriately interpreted in accordance with the doctrine of equivalents.

I claim:

1. A method of sputter depositing a metal onto a substrate, comprising the following steps:

placing a substrate within a reaction chamber;

providing a metal target having an erodible surface within the reaction chamber;

forming a plasma within the reaction chamber, the plasma comprising a mixture of noble gases, the plasma having a threshold plasma pressure below which the plasma will not exist, the mixture of noble gases being selected to substantially minimize the threshold plasma pressure; and contacting the plasma with the surface of the metal target to sputter deposit some of said metal onto said substrate.

2. A method of forming a plasma, comprising the following steps:

providing a mixture of noble gases; and forming a plasma from said mixture within a reaction chamber, the plasma having a threshold plasma pressure below which the plasma will not exist, the mixture of noble gases being selected to substantially minimize the threshold plasma pressure.

3. A method for forming a plasma within a reaction chamber, comprising the following steps:

flowing a first noble gas through the reaction chamber at a first noble gas flow rate and forming a plasma within the reaction chamber from the first noble gas, the first noble gas being initially flowed through the reaction chamber at an initial first noble gas flow rate;

flowing a mixing gas comprising a second noble gas through the reaction chamber at a mixing gas flow rate, the mixing gas being incorporated into the plasma, the combined mixing gas flow rate and first noble gas flow rate comprising at least part of a total gas flow rate;

after flowing the mixing gas through the reaction chamber, reducing the first noble gas flow rate and determining if the plasma has been extinguished;

if the plasma has not been extinguished, further reducing the first noble gas flow rate and again determining if the plasma has been extinguished, the steps of reducing the first noble gas flow rate and determining if the plasma has been extinguished being repeated until the plasma is extinguished;

if the plasma is extinguished, re-forming the plasma at an increased mixing gas flow rate and at about the initial first noble gas flow rate;

after re-forming the plasma, repeating the steps of reducing the first noble gas flow rate and determining if the plasma has been extinguished until the plasma is extinguished;

after extinguishing the re-formed plasma, determining if the total gas flow rate at which the re-formed plasma was extinguished is greater than the total gas flow rate at which the plasma was extinguished prior to increasing the mixing gas flow rate;

if the total gas flow rate at which the re-formed plasma was extinguished is not greater than the total gas flow rate at which the plasma was extinguished prior to increasing the mixing gas flow rate, in at least one iteration, repeating the steps of 1) increasing the mixing gas flow rate, 2) re-forming the plasma, 3) reducing the first noble gas flow rate until the re-formed plasma is extinguished, and 4) determining if the total gas flow rate at which the re-formed plasma is extinguished is greater than the total gas flow rate at which the plasma was extinguished prior to increasing the mixing gas flow rate; and if the total gas flow rate at which the re-formed plasma is extinguished is greater than the total gas flow rate at which the plasma was extinguished prior to increasing the mixing gas flow rate, establishing and maintaining a substantially stable plasma at about the mixing gas flow rate at which the total gas flow rate was minimized and at about the lowest first noble gas flow rate which will maintain the substantially stable plasma.

4. A method for forming a plasma within a reaction chamber, comprising the following steps:

(a) performing at least two iterations of the following steps (i) through (iv), with each iteration terminating when a plasma reaches a predetermined degree of instability, and with at least one of the iterations comprising a higher mixing gas flow rate than at least one other iteration;

(i) flowing a first noble gas through the reaction chamber at a first noble gas flow rate and forming a plasma within the reaction chamber from the first noble gas;

(ii) flowing a mixing gas comprising a second noble gas through the reaction chamber at a mixing gas flow rate, the mixing gas being incorporated into the plasma, the combined mixing gas flow rate and first noble gas flow rate comprising at least part of a total gas flow rate;

(iii) reducing the first noble gas flow rate by a first noble gas flow reduction amount; and (iv) determining if the plasma has reached a predetermined degree of instability; if the plasma has not reached the predetermined degree of instability, repeating steps (iii) and (iv); if the plasma has reached the predetermined degree of instability, determining a total gas flow rate at which the plasma reached the predetermined degree of instability, the total gas flow rate comprising a sum of the mixing gas flow rate and the first noble gas flow rate at which the plasma reached the predetermined degree of instability; and (b) if the total gas flow rate at which the plasma reached the predetermined degree of instability in an iteration comprising a higher mixing flow rate is greater than the total gas flow rate at which the plasma reached the predetermined degree of instability in an iteration comprising a lower mixing gas flow rate, establishing and maintaining a substantially stable plasma at about the lower mixing gas flow rate and at about a lowest first noble gas flow rate which will maintain the substantially stable plasma to thereby form a substantially stable plasma at substantially minimized pressure within the reaction chamber.

5. The method claim 4 wherein the predetermined degree of instability of the plasma is an extinguished plasma.

6. A method for substantially minimizing a threshold plasma pressure within a reaction chamber, comprising the following steps:

providing a gaseous mixture within the chamber, the gaseous mixture comprising a first noble gas and a second noble gas, and thereby comprising a ratio of the first noble gas within the gaseous mixture; and adjusting the ratio of the first noble gas within the gaseous mixture to substantially minimize the threshold plasma pressure of a plasma formed from the gaseous mixture.

7. The method of claim 6 wherein the step of adjusting the ratio of the first noble gas comprises the following steps:

flowing the first noble gas through the reaction chamber at a first noble gas flow rate and forming a plasma within the reaction chamber from the first noble gas;

flowing a mixing gas comprising the second noble gas through the reaction chamber at a mixing gas flow rate, the mixing gas being incorporated into the plasma, the combined mixing gas flow rate and first noble gas flow rate comprising at least part of a total gas flow rate;

reducing the first noble gas flow rate and determining if the plasma has reached a predetermined degree of instability;

if the plasma reaches the predetermined degree of instability, reforming a stable plasma at an increased mixing gas flow rate;

after re-forming the stable plasma, repeating the steps of reducing the first noble gas flow rate and determining if the plasma has reached the predetermined degree of instability until the plasma reaches the predetermined degree of instability;

after the re-formed plasma reaches the predetermined degree of instability, determining if the total gas flow rate at which the re-formed plasma reached the predetermined degree of instability is greater than the total gas flow rate at which the plasma reached the predetermined degree of instability prior to increasing the mixing gas flow rate; and if the total gas flow rate at which the re-formed plasma reached the predetermined degree of instability is greater than the total gas flow rate at which the plasma reached the predetermined degree of instability prior to increasing the mixing gas flow rate, establishing and maintaining a substantially stable plasma at about a mixing gas flow rate at which the total gas flow rate was minimized and at about the lowest first noble gas flow rate which will maintain the substantially stable plasma to thereby form a substantially stable plasma at substantially minimized pressure within the reaction chamber.

8. The method claim 7 wherein the predetermined degree of instability of the plasma is an extinguished plasma.

9. The method claim 7 wherein the first noble gas comprises argon.

10. A method for sputter deposition of a metal onto a semiconductor material, the method comprising the following steps:

providing a substrate of semiconductor material within a reaction chamber;

providing a metal target having an erodible surface within the reaction chamber;

providing a gaseous mixture comprising at least two noble gases within the reaction chamber;

forming a plasma from said gaseous mixture within the reaction chamber, the plasma having plasma components including a first of the at least two noble gases;

impacting plasma components onto the erodible surface of the metal target to sputter target atoms therefrom, the sputtered target atoms having a mean free path, a ratio of the first of the at least two noble gases to other plasma components being selected to substantially maximize the mean free path; and depositing the sputtered target atoms onto the substrate.

11. The method of claim 10 wherein the first of the at least two noble gases comprises argon.

12. A method for substantially maximizing the mean free path of sputtered target atoms within a reaction chamber, comprising the following steps:

providing a target within the reaction chamber, the target having target atoms;

providing a gaseous mixture within the reaction chamber, the gaseous mixture comprising at least two noble gases, and thereby comprising a ratio of a first of the at least two noble gases in the gaseous mixture;

forming a plasma from the gaseous mixture within the reaction chamber, the plasma having plasma components including the first of the at least two noble gases; and impacting the plasma components with the target to sputter target atoms therefrom, the ratio of the first of the at least two noble gases to other plasma components being selected to substantially maximize the mean free path of the sputtered target atoms.

13. The method of claim 12 wherein the first of the at least two noble gases comprises argon.

14. A method of sputter depositing a metal onto a substrate, comprising the following steps:

placing a substrate within a reaction chamber;

providing a metal target having an erodible surface within the reaction chamber;

providing a gaseous mixture comprising argon gas and helium gas within the reaction chamber;

forming a plasma from said gaseous mixture within the reaction chamber, the plasma thereby comprising the plasma components of argon and helium, the plasma having a threshold plasma pressure below which the plasma will not exist, a ratio of argon to other plasma components being selected to substantially minimize the threshold plasma pressure; and contacting the plasma with the surface of the metal target to sputter deposit some of said metal onto said substrate.

* * * * *

UNITED STATES PATENT AND TRADEMARK OFFICE
CERTIFICATE OF CORRECTION

PATENT NO. : 5,928,480
DATED : July 27, 1999
INVENTOR(S) : Shane P. Leiphart It is certified that error appears in the above-identified patent and that said Letters Patent is hereby corrected as shown below:

On the title page, Item [54] Replace "METHODS" (first occurrence) with --METHOD--; replace "DEPOSITING" with --DEPOSITION--; and replace "METHODS" (second occurrence) with --METHOD--.

Col. 1, l. 1:   Replace "METHODS" with --METHOD--.

Replace "DEPOSITING" with --DEPOSITION--.

Col. 2, l. 3:   Replace "METHODS" with --METHOD--.

Col. 7, l. 34:  Delete "is" (second occurrence)

Signed and Sealed this

Twenty-eighth Day of December, 1999

Attest:

Q. TODD DICKINSON

*Attesting Officer*      *Acting Commissioner of Patents and Trademarks*